United States Patent
Lin et al.

(10) Patent No.: US 9,504,176 B2
(45) Date of Patent: Nov. 22, 2016

(54) WATERPROOF STRUCTURE FOR USE IN DISPLAY DEVICE

(71) Applicant: Avalue Technology Inc., New Taipei (TW)

(72) Inventors: Ping-Chih Lin, New Taipei (TW); Cheng-Hsiung Chen, New Taipei (TW)

(73) Assignee: AVALUE TECHNOLOGY INC., New Taipei (TW)

(*) Notice: Subject to any disclaimer, the term of this patent is extended or adjusted under 35 U.S.C. 154(b) by 0 days.

(21) Appl. No.: 15/150,752

(22) Filed: May 10, 2016

(65) Prior Publication Data

US 2016/0255738 A1    Sep. 1, 2016

Related U.S. Application Data

(63) Continuation of application No. 14/587,561, filed on Dec. 31, 2014, now Pat. No. 9,374,922.

(51) Int. Cl.
*H05K 5/06* (2006.01)
*H05K 5/00* (2006.01)
*G02F 1/1333* (2006.01)

(52) U.S. Cl.
CPC ............ *H05K 5/061* (2013.01); *G02F 1/1333* (2013.01); *H05K 5/0004* (2013.01); *H05K 5/0017* (2013.01)

(58) Field of Classification Search
CPC ........ G06F 1/16; G06F 1/163; G06F 1/1601; G06F 1/1622; G06F 1/1654; G06F 1/1616; G06F 1/1633; G06F 1/1637; G06F 1/1626; G06F 1/1656; H05K 5/00; H05K 5/061; H05K 5/0004
USPC ............ 361/679.01, 679.02, 679.21, 679.22, 361/679.26, 679.3, 679.55, 679.56, 679.6, 361/800; 174/50.5; 312/223.1–223.3
See application file for complete search history.

(56) References Cited

U.S. PATENT DOCUMENTS

| | | | |
|---|---|---|---|
| 2006/0171107 A1* | 8/2006 | Yamamoto | G02F 1/133308 361/679.21 |
| 2009/0079904 A1* | 3/2009 | Yada | G02F 1/133308 349/60 |
| 2011/0261510 A1* | 10/2011 | Liu | G06F 1/1637 361/679.01 |
| 2012/0051022 A1* | 3/2012 | Dong | G02F 1/133308 361/807 |
| 2012/0162953 A1* | 6/2012 | Wojack | G06F 1/1626 361/809 |
| 2012/0314354 A1* | 12/2012 | Rayner | G06F 1/1656 361/679.01 |
| 2013/0221812 A1* | 8/2013 | Hashimoto | H05K 5/0004 312/7.2 |
| 2013/0222706 A1* | 8/2013 | Hashimoto | H04N 5/64 348/836 |
| 2013/0314863 A1* | 11/2013 | Tanaka | H04M 1/18 361/679.01 |
| 2015/0061477 A1* | 3/2015 | Wilson | H04B 1/3888 312/223.1 |

* cited by examiner

*Primary Examiner* — Courtney Smith
*Assistant Examiner* — Sagar Shrestha
(74) *Attorney, Agent, or Firm* — Chun-Ming Shih; HDLS IPR Services

(57) ABSTRACT

A waterproof structure for use in display device includes a back cover (100), a display module (200) and a waterproof member (300). The back cover (100) includes a peripheral part of back cover (110), a stop part (120) connected to the peripheral part of back cover (110), and a groove (130) defined between the peripheral part of back cover (110) and the stop part (120), wherein the height of the peripheral part of back cover (110) is greater than the height of the stop part (120). The display module (200) is disposed on the back cover (100). The waterproof member (300) is disposed between the display module (200) and the stop part (120). Accordingly, the speed of moisture permeating into the display device can be buffered so as to prolong the service life.

9 Claims, 7 Drawing Sheets

WATERPROOF STRUCTURE FOR USE IN DISPLAY DEVICE

CROSS-REFERENCE TO RELATED APPLICATIONS

This application is a continuation application of U.S. application Ser. No. 14/587,561 filed on Dec. 31, 2014, and entitled "WATERPROOF STRUCTURE FOR USE IN DISPLAY DEVICE". The entire disclosure is incorporated herein by reference.

BACKGROUND OF THE INVENTION

Field of the Invention

The present invention relates to a waterproof structure, especially to a waterproof structure for use in display device.

Description of Related Art

With the development of technology, an electronic device having a screen is commonly used in our daily lives for the purpose of transmitting data at work, exchanging messages or even providing entertainments. A general electronic device, such as a portable device, a smart phone, a tablet computer or even an industrial computer, has become a media widely used by consumers. Also, some consumers heavily rely on these electronic devices, for example thinking about various issues or taking a drink in front of a computer, watching TV in a bathroom, bringing the electronic device while going out, or even operating a computer in a severe environment.

For these precision display devices, moisture may permeate into the electronic device because of poor production or improper operation by consumers. For ensuring the performance and the service life of a display device, a waterproof structure is often installed for reducing the possibility of moisture permeating into the interior of a display device. A conventional waterproof structure for use in display device is to install one or a plurality of waterproof strips at the periphery of the display device, so a waterproof objective can be achieved through the waterproof strips being provided on a panel and a front frame. However, the right-angle connecting locations defined between the waterproof strips are unable to be tightly engaged, and a gap is very easily to be formed at the right-angle connecting locations, so a poor waterproof performance is caused and moisture is allowed to easily permeate. In addition, after the waterproof strip being used for a period of time, the waterproof strip would be deteriorated and fatigued, so the tight adhesion is no longer provided between the waterproof strip and the front frame or between the waterproof strip and the panel, and a situation of water or moisture permeating would occur which may cause short circuit, malfunction or loose contact in the electronic device.

For improving the existed problems, some skilled people in the art provide a design of installing waterproof structures (not limited to the above-mentioned waterproof strip) at proper locations of the display device; however, the installation of each additional waterproof structure would result in more complicated in production, increasing the production cost and hard to simplify the production procedure for satisfying massive production.

In view of the above-mentioned problems, the applicant of the present invention provides a design of enabling the water permeated into the display device to be easily discharged while the display device being in use, so the water can be prevented from being remained inside the machinery and the smooth operation of internal components can be ensured.

SUMMARY OF THE INVENTION

The present invention is to provide a waterproof structure for use in display device capable of effectively buffering the speed of moisture permeating into the display device so as to prolong the service life.

The present invention is to provide a waterproof structure for use in display device capable of effectively discharging water thereby preventing the water from being remained in the display device so as to ensure the smooth operation of internal components.

Accordingly, the present invention provides a waterproof structure for use in display device, which includes a back cover, a display module and a waterproof member. The back cover includes a peripheral part of back cover, a stop part connected to the peripheral part of back cover, and a groove defined between the peripheral part of back cover and the stop part, wherein the height of the peripheral part of back cover is greater than the height of the stop part. The display module is disposed on the back cover. The waterproof member is disposed between the display module and the stop part.

Preferably, the peripheral part of back cover and the stop part are continuously connected thereby forming an enclosed rectangular shape allowing the display module to be disposed. The groove further includes a plurality of partition pieces, each of the partition pieces is respectively connected to one lateral wall of the peripheral part of back cover and one lateral wall of the stop part, and the length/height of each of the partition pieces is smaller than the length/height of the stop part. Each of the partition pieces is formed in a rectangular, elliptical or polygonal shape.

Preferably, the waterproof member is formed in an annular status and adhered on one lateral surface of the display module. The waterproof member is integrally formed as an annular structure adhered on one lateral surface of the display module. The waterproof member includes two waterproof parts, and the cutting surface of each of the waterproof parts is respectively formed as an inclined surface or a polygonal surface for being engaged with each other so as to form an annular structure.

In comparison with related art, the present invention has advantageous features as follows. Through each of the partition pieces being connected to the peripheral part of back cover and the stop part, the danger of water or moisture permeating into the display module can be further relieved, so the display module is able to be prevented from being damaged or abnormally operated, and an advantage of convenient in production can also be provided. In other words, the installation of the partition pieces can solve the problem of the stop part generating stress concentration due to the smaller dimension, and the groove between the peripheral part of back cover and the stop part is also provided with an advantage of allowing a mold to be easily released. Moreover, for increasing the production efficiency and enhancing the positioning effect, the present invention further includes a supporter. The supporter installed corresponding to the back cover is formed with at least one semi-circular positioning post allowing at least one positioning hole formed on the back cover to be assembled and positioned.

DETAILED DESCRIPTION OF THE INVENTION

The present invention provides a waterproof structure for use in display device capable of slowing moisture permeating into the display device. According to the present invention, the display device is preferably to be a computer system capable of being independently operated and installed with a screen, such as a tablet computer, an industrial computer or other similar electronic devices. However, according to other embodiments, the display device can also be an electronic device having a screen, such as a notebook computer, a mobile phone, a digital camera, a monitor or other electronic devices. The backlight source of the display device includes, but not limited to, a liquid crystal, light emitting diode (LED) or plasma for providing the backlight source. Preferred embodiments of the present invention will be described with reference to the drawings.

Figure 1:
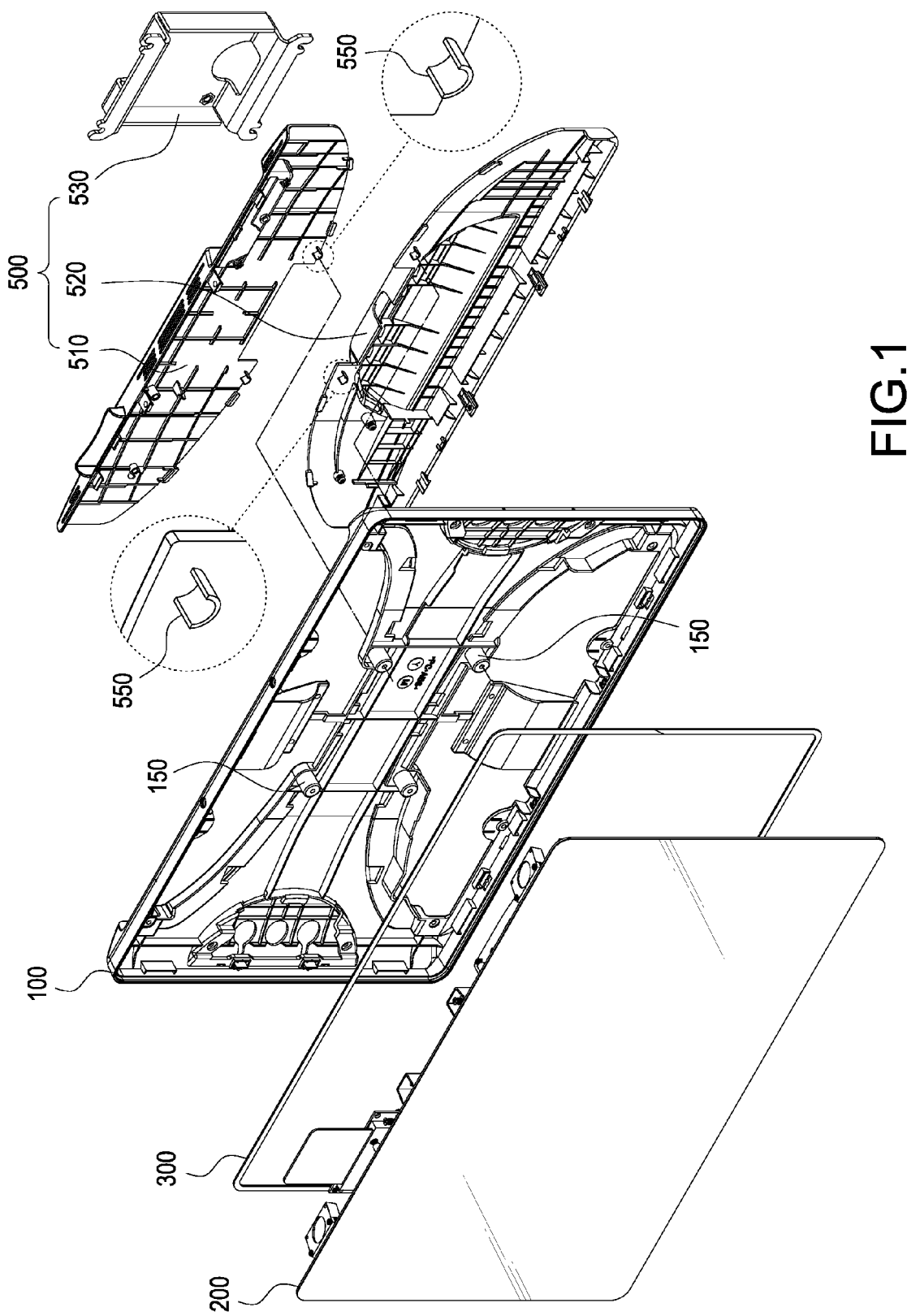
FIG. 1 is an exploded view showing a waterproof structure for use in display device according to one embodiment of the present invention.
Figure 2:
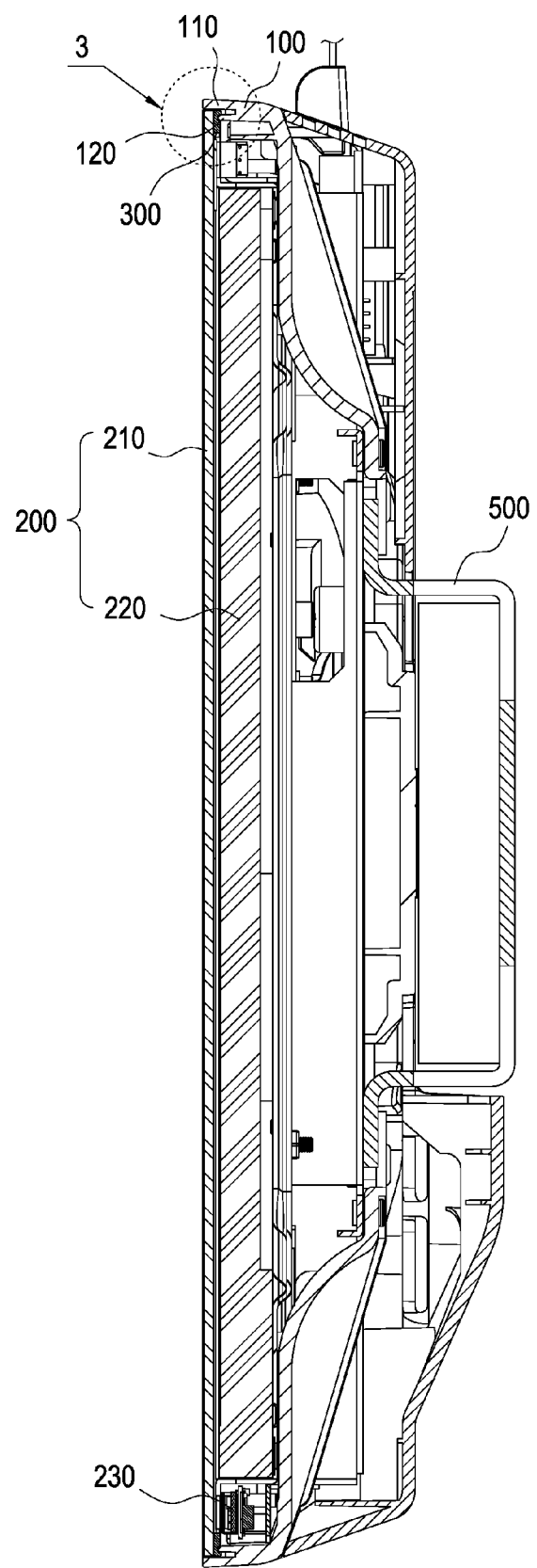
FIG. 2 is a cross sectional view showing the assembly of the waterproof structure for use in display device according to one embodiment of the present invention.
Figure 3:
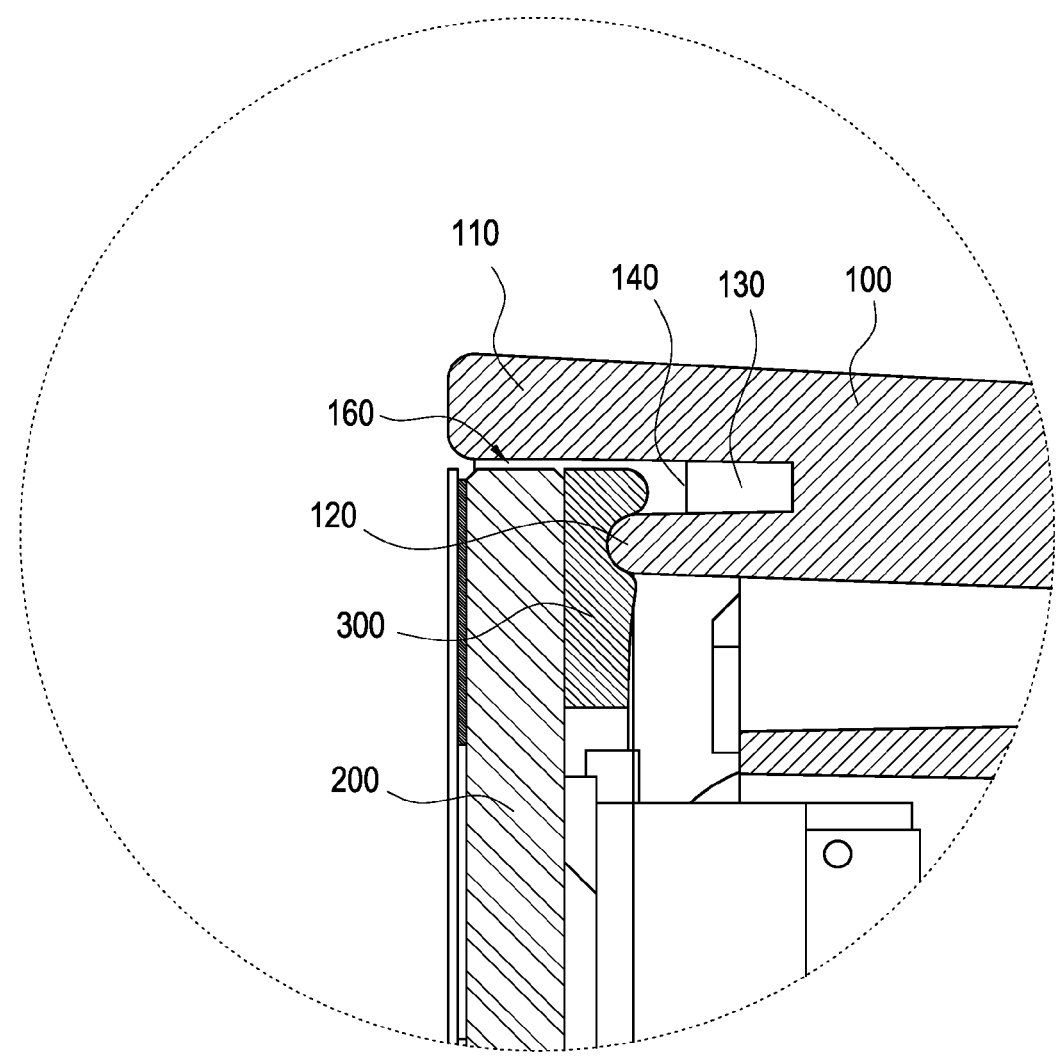
FIG. 3 is a partially enlarged view of FIG. 2.

Please refer from FIG. 1 to FIG. 3, the waterproof structure for use in display device includes a back cover (100), a display module (200) and a waterproof member (300). The back cover (100) includes a peripheral part of back cover (110), a stop part (120) connected to the peripheral part of back cover (110) and a groove (130) defined between the peripheral part of back cover (110) and the stop part (120), wherein the height of the peripheral part of back cover (110) is greater than the height of the stop part (120). The display module (200) is disposed on the back cover (100). The waterproof member (300) is disposed between the display module (200) and the stop part (120).

According to this embodiment, a supporter (500) is further included for being assembled with the back cover (100). For increasing the production efficiency and enhancing the positioning effect, at least one semi-circular positioning post (550) is formed on the supporter (500) corresponding to the back cover (100), thereby allowing at least one positioning hole (150) formed on the back cover (100) to be assembled and positioned. As shown in FIG. 1, the supporter (500) further includes an upper support (510) and a lower support (520) and a connection piece (530) respectively connected to the upper support (510) and the lower support (520). Substantially, each of the semi-circular positioning posts (550) is preferably to be respectively formed on one lateral surface of the upper support (510) and one lateral surface of the lower support (520), thereby allowing the corresponding positioning holes 150 of the back cover (100) to be assembled and positioned. The semi-circular positioning post (550) is provided with an advantage of less likely to generate stress concentration thereby avoiding the occurrence of deformation, and a more precise positioning relation can be formed between the semi-circular positioning post (550) and the positioning hole (150).

As shown in FIG. 2, the display module (200) includes a display panel (210), a backlight source (220), a drive IC and circuit board (230) or other components. The display module (200) is deemed as a prior art, therefore no further illustration is provided. As shown in FIG. 1 and FIG. 2, the peripheral part of back cover (110) and the stop part (120) are continuously connected thereby forming an enclosed rectangular shape allowing the display module (200) to be disposed. As shown in FIG. 3, the groove (130) further includes a plurality of partition pieces (140), and each of the partition pieces (140) is respectively connected to one lateral wall of the peripheral part of back cover (110) and one lateral wall of the stop part (120); in other words two sides of each of the partition pieces (140) are respectively connected to the lateral wall of the peripheral part of back cover (110) and the lateral wall of the stop part (120) defined in the groove (130), the above-mentioned structure will be further disclosed thereinafter.

For allowing the display module (200) to be easily assembled with the back cover (100), the back cover (100) can be formed with an assembly tolerance for facilitating the assembly of the display module (200). As shown in FIG. 3, one side of the display module (200) or the waterproof member (300) is adjacently connected to an inner wall of the peripheral part of back cover (110), so water may enter from the assembly tolerance. However, the groove (130) between the peripheral part of back cover (110) and the stop part (120) is able to provide a buffering effect, so water is prevented from directly flowing in from a gap (160) defined between the back cover (100) and the display module (200). Even if the water accidentally flows in the groove (130) disclosed in this embodiment, the groove (130) can be served to effectively discharge the water from the gap (160), thereby preventing water from remaining in the electronic device, and the smooth operation of internal components can be ensured. Moreover, according to the embodiment disclosed in FIG. 3, the thickness/width of the peripheral part of back cover (110) is greater than the thickness/width of the stop part (120).

Figure 4:
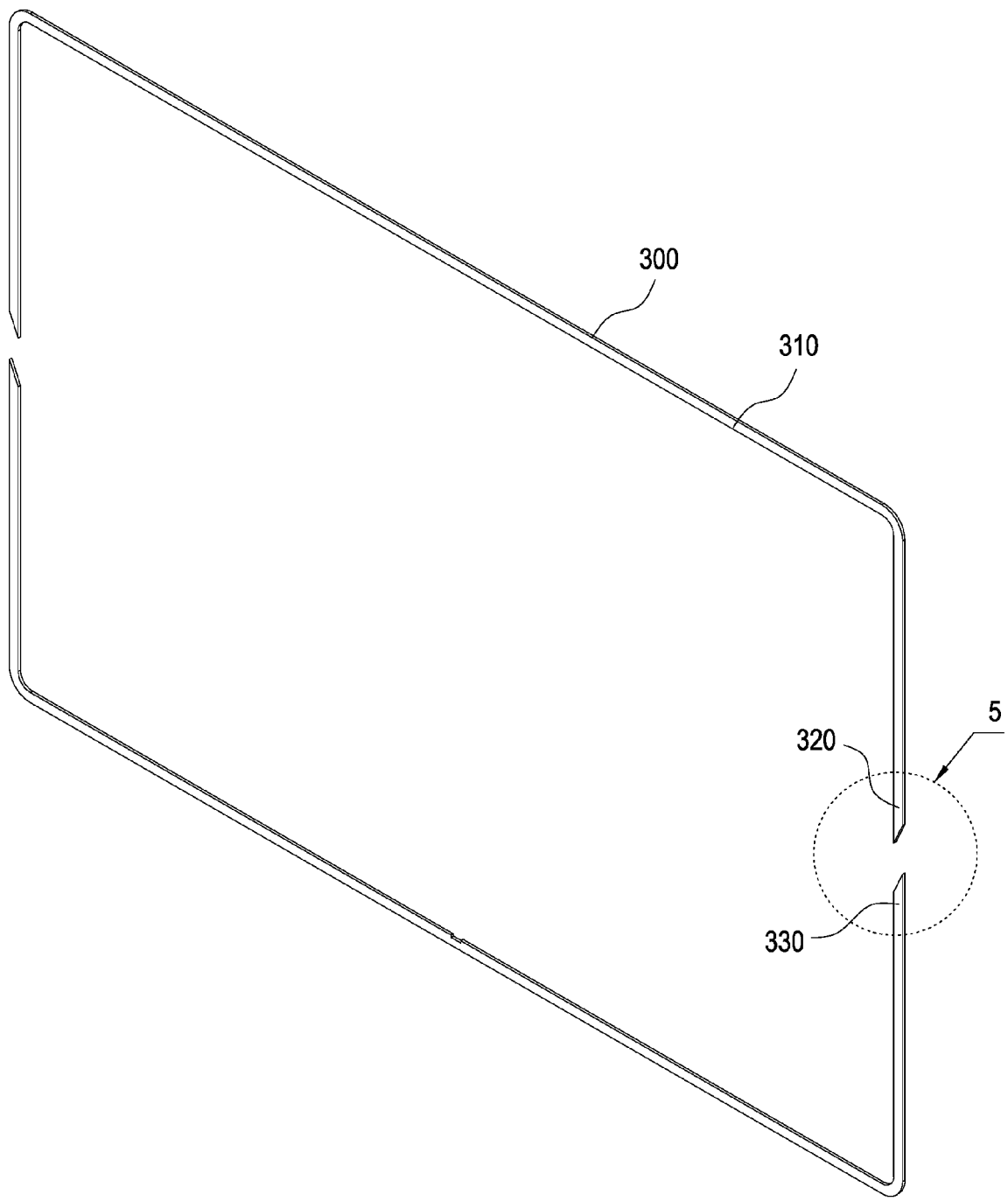
FIG. 4 is a perspective view showing the waterproof member according to the present invention.
Figure 5:
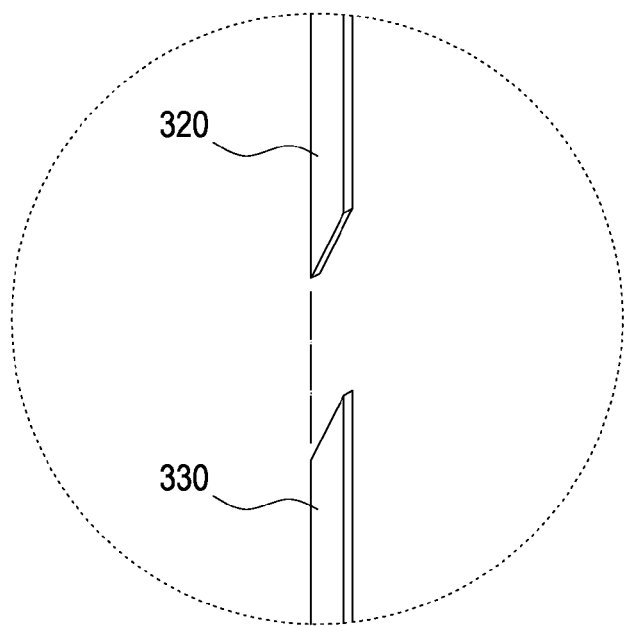
FIG. 5 is a partially enlarged view of FIG. 4.
Figure 6:
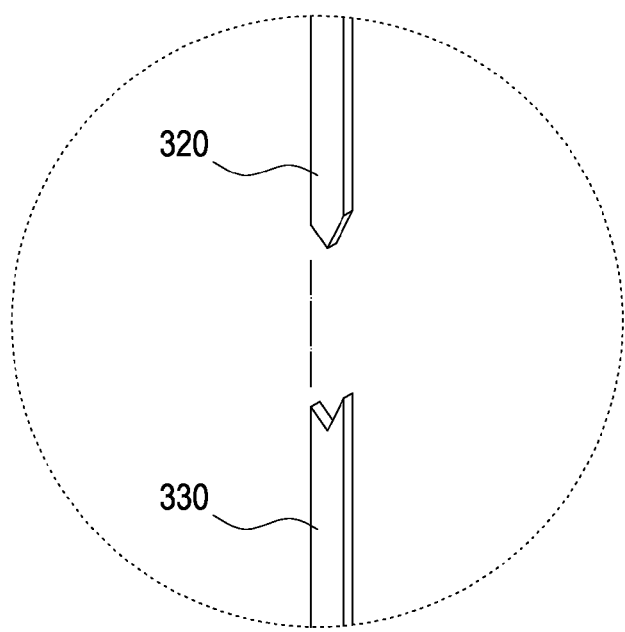
FIG. 6 is a schematic view of FIG. 4 according to another embodiment of the present invention.

Please refer to FIG. 4, the waterproof member (300) is formed in an annular status and adhered on one lateral surface of the display module (200). Preferably, the waterproof member (300) is integrally formed as an annular structure (310) adhered on one lateral surface of the display module (200). As shown in FIG. 4, the waterproof member (300) can also be formed as the annular structure (310) composed of two waterproof parts (320), (330) being engaged with each other. For preventing moisture from permeating into the display module (200) from the cutting edges of the waterproof parts (320), (330), the cutting surface of each of the waterproof parts (320), (330) is formed as an inclined surface as shown in FIG. 5. According to the embodiment disclosed in FIG. 6, the cutting surface of each of the waterproof parts (320), (330) can also be formed as a polygonal surface or other suitable geometric surface. Moreover, the material of which the waterproof member (300) is made can be: silicon, plastic, rubber, Polyethylene Terephthalate (PET) or other suitable materials.

Figure 8:
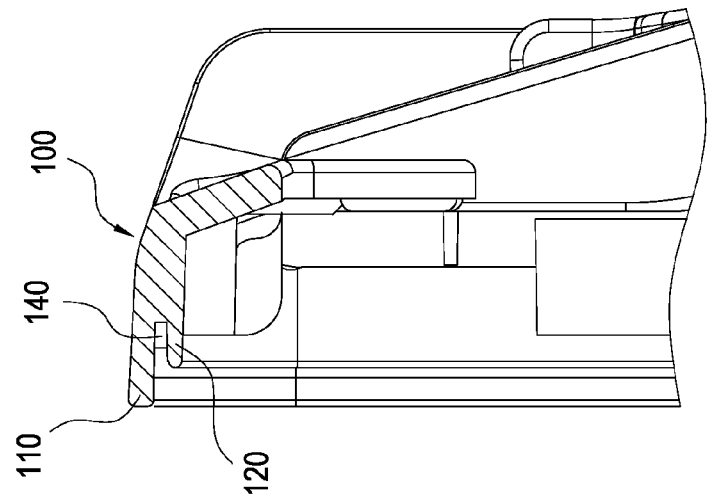
FIG. 8 is a cross sectional view of FIG. 7 taken along A-A.
Figure 7:
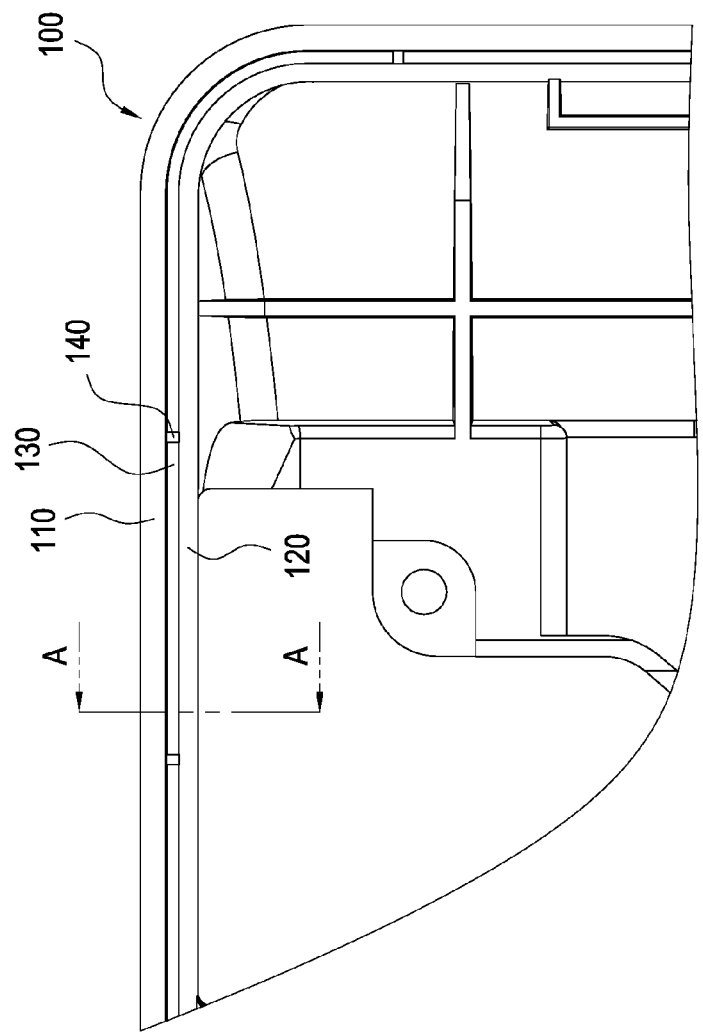
FIG. 7 is a partially frontal view showing the back cover according to the present invention.
Figure 10:
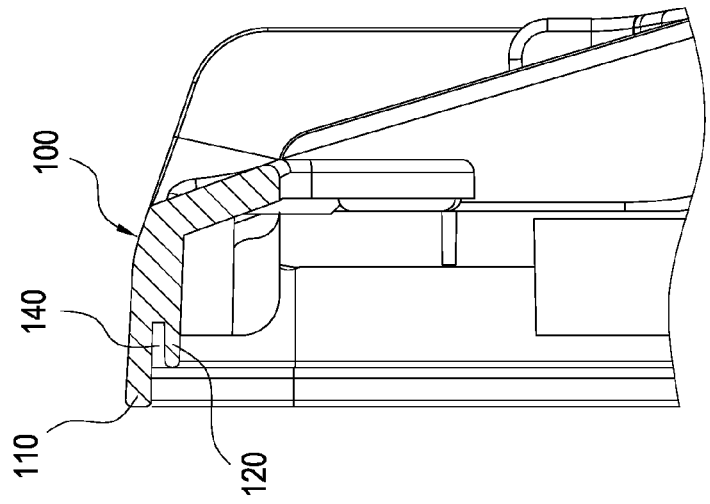
FIG. 10 is a cross sectional view of FIG. 9 taken along B-B.
Figure 9:
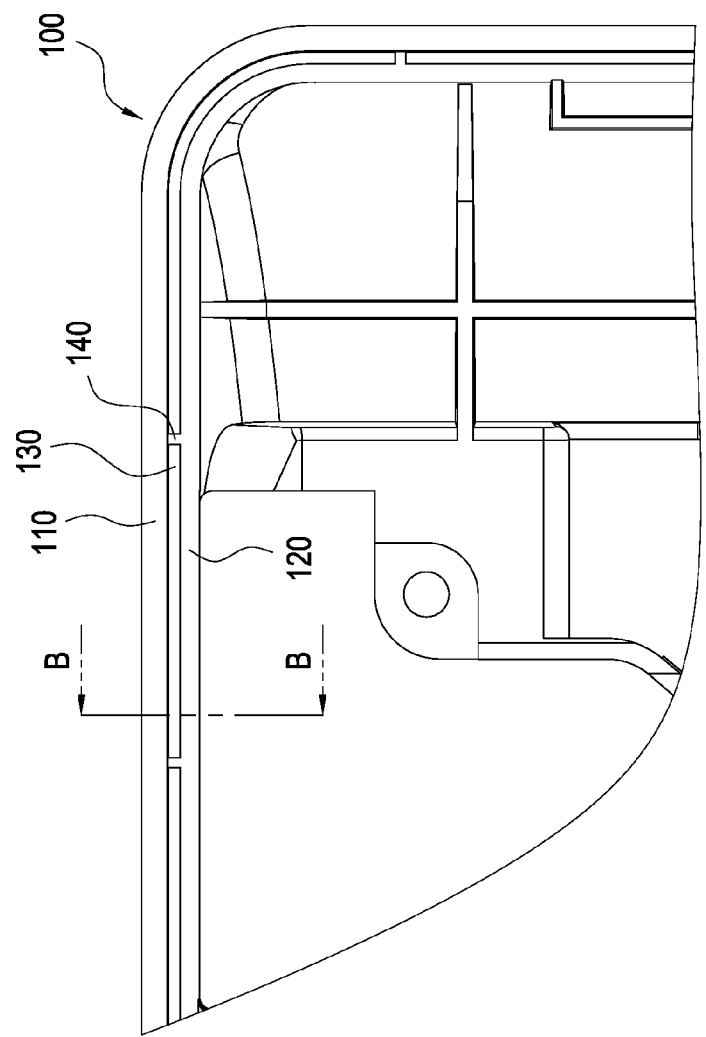
FIG. 9 is another partially frontal view showing the back cover according to the present invention.

Please refer to FIG. 7 and FIG. 8, each of the partition pieces (140) arranged at the periphery of the back cover (100) is mainly served to increase the difficulty for moisture entering the display module (200); in other words the time for moisture directly permeating into the electronic device can be buffered. According to this embodiment, the length/height of each of the partition pieces (140) is smaller than the length/height of the stop part (120). However, according to the embodiment disclosed in FIG. 9 and FIG. 10, the length/height of each of the partition pieces (140) can also be equal to the length/height of the stop part (120) with respect to the actual needs. Moreover, the shape of each of the partition pieces (104) can be for example but not limited to rectangular, elliptical or polygonal.

Through each of the partition pieces (140) being connected to the peripheral part of back cover (110) and the stop part (120), the danger of water or moisture permeating into the display module (200) can be further relieved, the display module (200) is able to be prevented from being damaged or abnormally operated, and an advantage of convenient in production can also be provided. In other words, the installation of the partition pieces (140) can solve the problem of the stop part (120) generating stress concentration due to the smaller dimension, and the groove (130) between the peripheral part of back cover (110) and the stop part (120) is also provided with an advantage of allowing a mold to be easily released.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A waterproof structure for use in display device, including:
    a back cover, including a peripheral part of back cover, a stop part connected to the peripheral part of back cover, and a groove defined between the peripheral part of back cover and the stop part, wherein a height of the peripheral part of back cover being greater than a height of the stop part;
    a display module, disposed on the back cover, wherein a gap is defined between the back cover and the display module, so water in the groove is capable of being discharged through the gap; and
    a waterproof member, disposed between the display module and the stop part,
    wherein the groove further includes a plurality of partition pieces, and each of the partition pieces is respectively connected to one lateral wall of the peripheral part of back cover and one lateral wall of the stop part.

2. The waterproof structure for use in display device according to claim 1, wherein the peripheral part of back cover and the stop part are continuously connected thereby forming an enclosed rectangular shape allowing the display module to be disposed.

3. The waterproof structure for use in display device according to claim 1, wherein a length/height of each of the partition pieces is smaller than a length/height of the stop part, and each of the partition pieces is formed in a rectangular, elliptical or polygonal shape.

4. The waterproof structure for use in display device according to claim 1, wherein a thickness/width of the peripheral part of back cover is greater than a thickness/width of the stop part.

5. The waterproof structure for use in display device according to claim 1, wherein one side of the display module or the waterproof member is adjacently connected to an inner wall of the peripheral part of back cover.

6. The waterproof structure for use in display device according to claim 1, wherein the waterproof member is formed in an annular status and adhered on one lateral surface of the display module.

7. The waterproof structure for use in display device according to claim 1, wherein the waterproof member is integrally formed as an annular structure adhered on one lateral surface of the display module.

8. A waterproof structure for use in display device, including:
    a back cover, including a peripheral part of back cover, a stop part connected to the peripheral part of back cover, and a groove defined between the peripheral part of back cover and the stop part, wherein a height of the peripheral part of back cover being greater than a height of the stop part;
    a display module, disposed on the back cover, wherein a gap is defined between the back cover and the display module, so water in the groove is capable of being discharged through the gap; and
    a waterproof member, disposed between the display module and the stop part,
    wherein the waterproof member includes two waterproof parts, and a cutting surface of each of the waterproof parts is respectively formed as an inclined surface or a polygonal surface for being engaged with each other so as to form an annular structure.

9. A waterproof structure for use in display device, including:
    a back cover, including a peripheral part of back cover, a stop part connected to the peripheral part of back cover, and a groove defined between the peripheral part of back cover and the stop part, wherein a height of the peripheral part of back cover being greater than a height of the stop part;
    a display module, disposed on the back cover, wherein a gap is defined between the back cover and the display module, so water in the groove is capable of being discharged through the gap;
    a waterproof member, disposed between the display module and the stop part; and
    a supporter formed with at least one semi-circular positioning post, wherein the back cover is further formed with at least one positioning hole thereby allowing the at least one semi-circular positioning post to be positioned.

* * * * *